United States Patent
Ajit

(10) Patent No.: US 6,359,484 B1
(45) Date of Patent: Mar. 19, 2002

(54) SLEW-RATE-CONTROL STRUCTURE FOR HIGH-FREQUENCY OPERATION

(75) Inventor: Janardhanan S. Ajit, Sunnyvale, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/618,961

(22) Filed: Jul. 19, 2000

(51) Int. Cl.$^7$ ................................................ H03K 5/12
(52) U.S. Cl. ...................................................... 327/170
(58) Field of Search ................................ 327/108, 112, 327/427, 133, 134, 170, 260, 434; 326/82, 83, 85, 86, 87

(56) References Cited

U.S. PATENT DOCUMENTS

| | | | | |
|---|---|---|---|---|
| 5,319,260 A | * | 6/1994 | Wanlass | 327/112 |
| 5,623,216 A | * | 4/1997 | Penza et al. | 326/27 |
| 6,064,230 A | * | 5/2000 | Singh | 326/83 |
| 6,163,178 A | * | 12/2000 | Stark et al. | 327/108 |

* cited by examiner

Primary Examiner—My-Trang Nu Ton
(74) Attorney, Agent, or Firm—Townsend and Townsend and Crew LLP

(57) ABSTRACT

The present invention provides an integrated circuit driver having multiple resistance paths that switch on at different stages of the rising and falling transitions of the driver's output signal waveform. The driver also has a control circuit configured to turn on the one or more resistance paths during at least one predetermined stage of the output signal during transitions, thus reducing the control circuit's effective resistance to control the slope of the transitions during the predetermined stage.

16 Claims, 10 Drawing Sheets

SLEW-RATE-CONTROL STRUCTURE FOR HIGH-FREQUENCY OPERATION

BACKGROUND OF THE INVENTION

The present invention relates generally to the design of integrated circuit products in the semiconductor industry and more particularly to a slew-rate-control circuit that controls different stages of the transitions of an output signal.

Slew-rate-control circuits generally ensure that the output voltage waveforms do not exhibit ringing. The most widely used slew-rate control for output voltage consists of coupling a resistor, also referred to as a slew-rate-control (SRC) resistor, in series with the gate capacitance of a driver transistor.

FIG. 1A shows a schematic diagram of a circuit buffer 100 having a conventional slew-rate-control structure 110 (110a and 110b) for high-frequency operation. The SRC resistor (110a and 110b) couples in series with the gate capacitance of the driver transistor (112 and 114, respectively) to create a combination of resistance and capacitance, referred to as the RC. The RC gives exponential transition (rising and falling) output voltage waveforms from the driver transistor.

The RC controls the internal current and capacitances of the driver transistor which in turn control the slope of output waveform at an output node 116. This slope is known as the slew rate (SR). Stated differently, the SR is the maximum rate of change of the output voltage, $(d_v/d_t)_{max}$. The SRC resistor thus contributes to the RC delay such that the resistance is inversely proportional to the SR, or 1/R SR. Accordingly, if the resistance increases, the SR decreases, and vice versa.

FIG. 1B shows an output waveform 120 of simulation results of a conventional slew rate control structure. FIG. 1B also shows a slew rate waveform 120', a derivative, $(d_v/d_t)$, of output waveform 120. A disadvantage is that the initial and final stages of the transition are drastically increased, increasing the overall transition time. The initial stage is defined from the 0% to 10% portion 130a of the rising waveform and from the 100% to 90% portion 130b of the falling waveform. The middle stage is defined from 10% to 90% portion 135 of the transition from low to high (rising), and from high to low (falling). The final stage is defined from the 100% to 90% portion 140a of the rising waveform and from the 0% to 10% portion 140b of the falling waveform.

Another disadvantage with the conventional approach is that it causes an increased resistance and capacitance. This further increases the time during the initial stage of the transition. Specifically, during the initial stages of the output voltage transition, the pre-driver transistors are not fully turned-on resulting in a higher resistance in series with the gate capacitance. Also, the gate capacitance is in transition from a high value in accumulation to a low value in inversion. Hence, the gate capacitance may be slightly higher during the initial stages of the transition of the output voltage.

It is desirable in integrated-circuit chips to have waveforms which transition in a controlled manner. It is also desirable to keep the maximum SR below a specified value to reduce the inductive bounce noise at ground and $V_{DD}$. It is also desirable to achieve this reduced slew rate without significantly compromising the operation speed of the circuit.

SUMMARY OF THE INVENTION

The present invention achieves the above needs and objectives with a new and improved slew-rate-control circuit that controls different stages of the transitions of an output signal. More particularly, the present invention provides an integrated circuit driver having multiple resistance paths that switch on at different stages of the rising and falling transitions of the driver's output signal waveform. The driver has a control circuit configured to turn on the one or more resistance paths during at least one predetermined stage of the output signal during transitions, thus reducing the control circuit's effective resistance to control the slope of the transitions during the predetermined stage. The predetermined stage is one of an initial-stage, mid-stage, and final-stage of the output signal transitions.

In a specific embodiment, at least one transistor can provide a resistance path, the transistor being configured to switch on during at least one predetermined stage of the output signal during transitions.

In another specific embodiment, the driver circuit can have at least two complementary output transistors, at least one resistance control transistor being biased by a voltage at the output node or a voltage from the output node through an inverter. Alternatively, the control transistor can also be biased by a voltage at the gate of at least one of the complementary output transistors.

In another specific embodiment, the driver can have at least one feedback circuit having an input coupled to the gate one of the complementary transistors and an output coupled to the gate of at least one of the control transistors.

In another specific embodiment, the driver can have a high-voltage circuit coupled between the output node and the control circuit to protect the control circuit against high-voltages.

The present invention achieves the above purposes and benefits in a simple, versatile, and reliable circuit and method that is readily suited to the widest possible utilization. The present invention achieves these purposes and benefits in the context of known circuit technology and known techniques in the electronic arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

DESCRIPTION OF THE SPECIFIC EMBODIMENTS

With reference to the drawings, the new and improved slew-rate-control circuit that controls different stages of the transitions of an output signal and a method according to the present invention will now be described.

The new invention allows the circuit to operate at high frequency while keeping the maximum SR below a specified value. In particular, the invention keeps the SR constant over the output-voltage transitions, or waveform, by controlling the SR during the initial, middle, and final stages of the transitions. This reduces the transition times while maintaining a maximum SR. This also allows a circuit, to which the present invention is applied, operate at a higher frequency compared to circuits employing the conventional circuit. In specific embodiments of the present invention, the slew-rate-control (SRC) structure can be applied to both output and input/output (I/O) buffer, current and voltage driver circuits, etc.

Generally, the SRC structure of the present invention can have several components for controlling the output waveform. The present invention can be used, for example, to control the SR to match the output waveform requirements of a subsequent stage. The first component is an initial-stage-linearizing (ISL) transistor for controlling the 0% to 10% portion of the rising waveform and the 100% to 90% portion of the falling waveform. The second component is a mid-slew-rate-control (MSRC) transistor for controlling the 10% to 90% portion of the rising waveform and the 90% to 10% portion of the falling waveform. The third component is the final-stage-linearizing (FSL) transistor for controlling the 90% to 100% portion of the rising waveform and the 10% to 0% portion of the falling waveform. These components can be used individually or in combination. They can also be used with or without a conventional SRC resistor to control the SR of output voltage. While the specific embodiments described herein reflect these combinations, the present invention is not limited to these embodiments.

The present invention thus achieves an output voltage that is close to linear, i.e., the slew rate is kept approximately constant during transitions. A particular waveform of choosing can be controlled by choosing an appropriate value for the SRC resistor, if used, and the sizes of the ISL, MSRC, and FSL transistors. For example, the MSRC transistor can replace the SRC resistor or can be used in parallel to the SRC resistor.

Figure 2A:
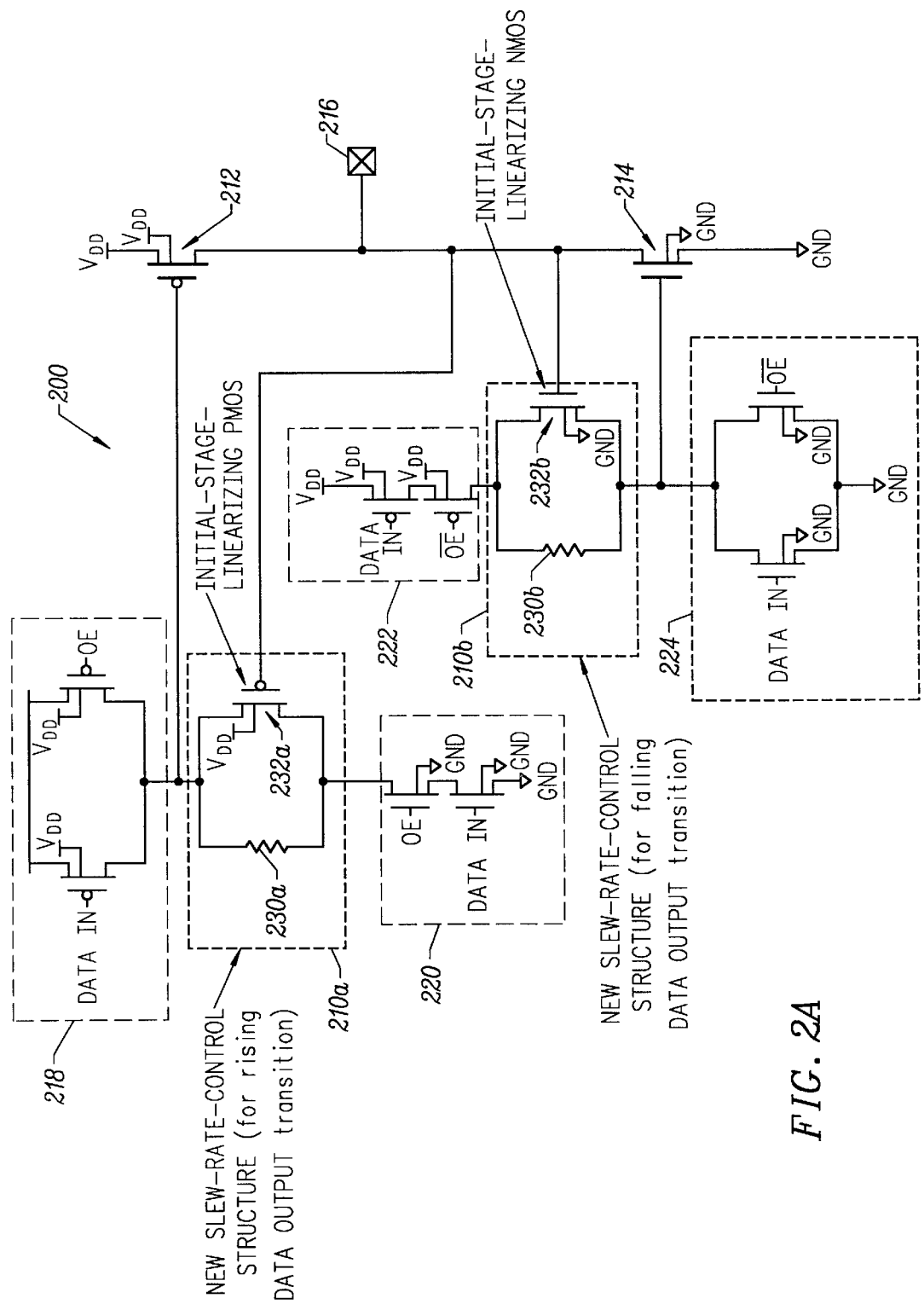
FIG. 2A shows a schematic diagram of a circuit buffer having a slew-rate-control (SRC) structure for high-frequency operation according to the present invention.

FIG. 2A shows a schematic diagram of a circuit buffer 200 having a slew-rate-control (SRC) structure 210 (210a and 210b) for high-frequency operation according to the present invention. This diagram is merely an example and should not limit the scope of the claims herein. One of ordinary skill in the art would recognize many other variations, modifications, and alternatives. In a specific embodiment, buffer 200 is an output buffer. Buffer 200 includes driver circuits 212 and 214 operatively coupled to an output node 216 to source current to a load (not shown) and to sink current from the load, respectively. In specific embodiments, driver circuit 212 is a PMOS transistor and driver transistor 214 is an NMOS transistor. Transistors 212 and 214 couple to supply voltages $V_{DD}$ and $V_{SS}$, respectively. $V_{SS}$ is represented as ground.

Transistor 212 operatively couples to a pre-driver pull-up circuit 218 and to a pre-driver pull-down circuit 220 via SRC circuit 210a. Similarly, transistor 214 operatively couples to a pre-driver pull-up circuit 222 via SRC circuit 210b and to a pre-driver pull-down circuit 224. Both pre-driver pull-up circuits 218 and 222 couple to $V_{DD}$, and both pre-driver pull-down circuits 220 and 224 couple to ground. Also, the pre-driver circuits are configured to receive an input signal DATA IN and an output enable signal OE. Pre-driver circuits provide control signals to driver transistors 212 and 214.

During rising transitions, a logical high at DATA IN turns transistor 212 on (pull-down circuit 220 pulls the gate of transistor 212 low) and transistor 214 off (pull-down circuit 224 pulls the gate of transistor 214 low). Conversely, during falling transitions a logical low at DATA IN turns transistor 212 off and transistor 214 on. Buffer circuits are well-known in the art. The SRC structures 210a and 210b are described below in more detail.

In a specific embodiment, SRC structure 210a includes a resistor 230a and an ISL transistor 232a coupled in parallel between the gate of transistor 212 and pull-down circuit 220. Similarly, SRC structure 210b includes a resistor 230b and an ISL transistor 232b coupled in parallel between pull-up circuit 222 and the gate of transistor 214. SRC structures 210a and 210b control the waveform during the rising and falling transitions, respectively. The gates of transistors 232a and 232b are coupled to node 216. In a specific embodiment, ISL transistor 232a is a PMOS transistor and ISL transistor 232b is an NMOS transistor.

During the rising transitions, transistor 232a is on during the initial and mid stages of the waveform transitions and is substantially off during the final stage. (When and how long each transistor is on or off will depend on the specific design requirements. For example, how long into the mid stage transistor 232a stays on will depend on the specific design requirements. In this specific embodiment, the primary purpose of transistor 232a is to shape the output waveform during the initial stage.) Conversely, transistor 232b is substantially off during the initial and mid stages and on during the final stage. The reverse is true for both the ISL transistors during the falling transitions. This reduces the effective resistance of the appropriate SRC structure (structure 210a for rising transitions and 210b for falling transitions) during the initial stage (and during part of the middle stage) of the waveform transitions, thus reducing the amount of time in the initial stage. The overall switching speed is thus increased. The SR can be controlled to be close to linear by choosing appropriate value for resistors 210a and 210b and the sizes of the transistors 232a and 232b.

Figure 2B:
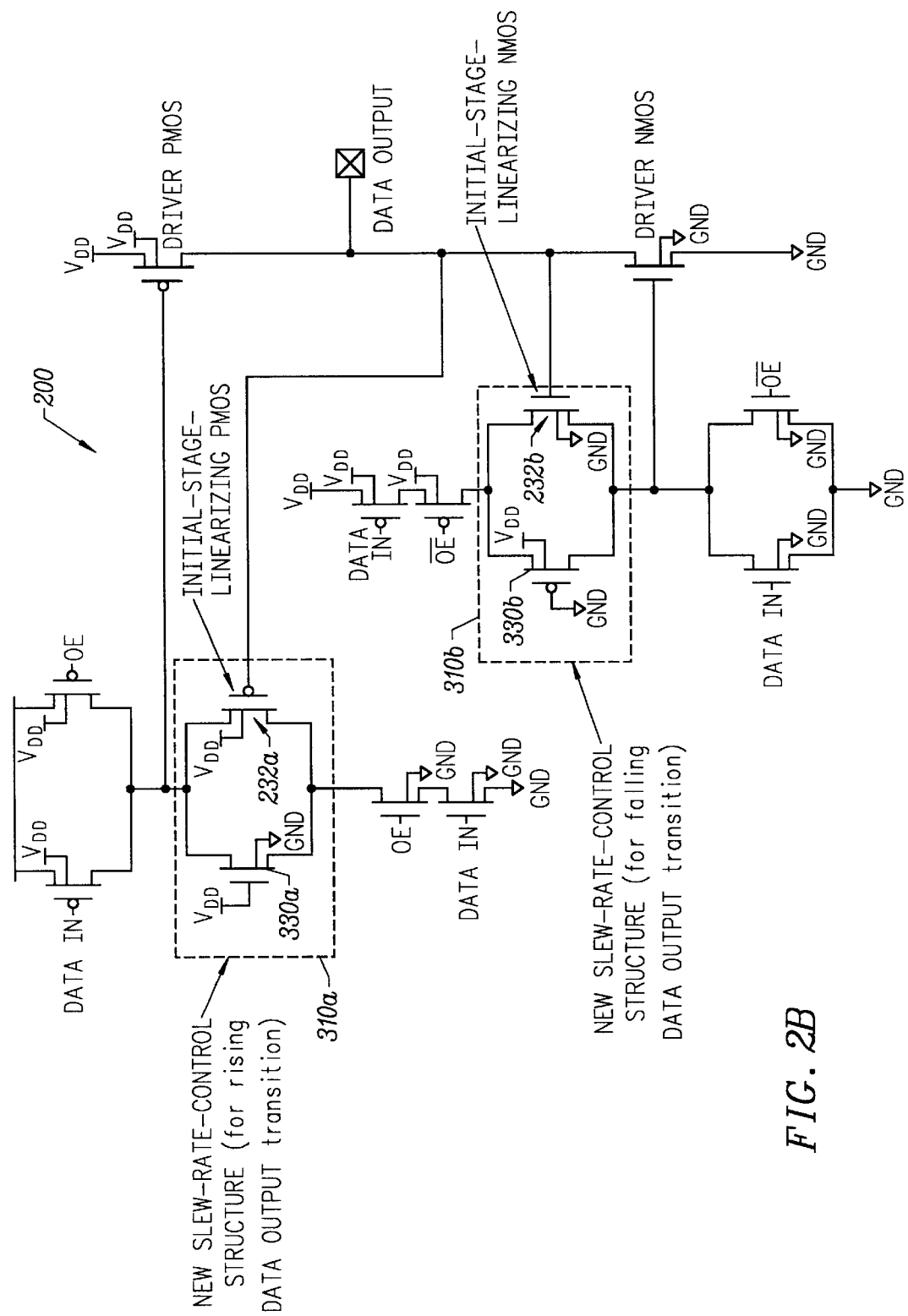
FIG. 2B shows a schematic diagram of circuit buffer of FIG. 2A having another embodiment of the SRC structure according to the present invention.

FIG. 2B shows a schematic diagram of circuit buffer 200 of FIG. 2A having another embodiment of the SRC structure 310 (310a and 310b) according to the present invention. This diagram is merely an example and should not limit the scope of the claims herein. One of ordinary skill in the art would recognize many other variations, modifications, and alternatives. In a specific embodiment, SRC structures 310a and 310b are similar to SRC structures 210a and 210b of FIG. 2A, respectively, but differ in that resistors 230a and 230b are replaced with MSRC transistors 330a and 330b, respectively. In this specific embodiment, transistor 330a is an NMOS transistor with its gate coupled to $V_{DD}$ so that it is always on, and transistor 330b is a PMOS transistor with its gate coupled to ground so that it is always on. Alternatively, in another embodiment (not shown), transistor 330a could be a PMOS transistor with its gate coupled to ground, and transistor 330b could be an NMOS transistor with its gate coupled to $V_{DD}$. MSRC transistors 330a and 330b are beneficial because their channel resistance is easy to fabricate. Also, the resistance can be high without the transistor taking too much space. In operation, MSRC transistors 330a and 330b act as resistors and control the SR from the 10% to 90% portion of the waveform transition during both the rising and falling transitions. Because MSRC transistors 330a and 330b are always on they do contribute the RC during all three stages of the transitions. The primary purpose of the MSRC is to control the middle stage of the output waveform transitions. In this specific embodiment, transistors 232a and 232b contribute the primary shaping of the initial stage portions of the transitions. MSRC transistors 330a and 330b allow the circuit to operate at high frequencies while keeping the maximum slew rate below a specified value.

Figure 2C:
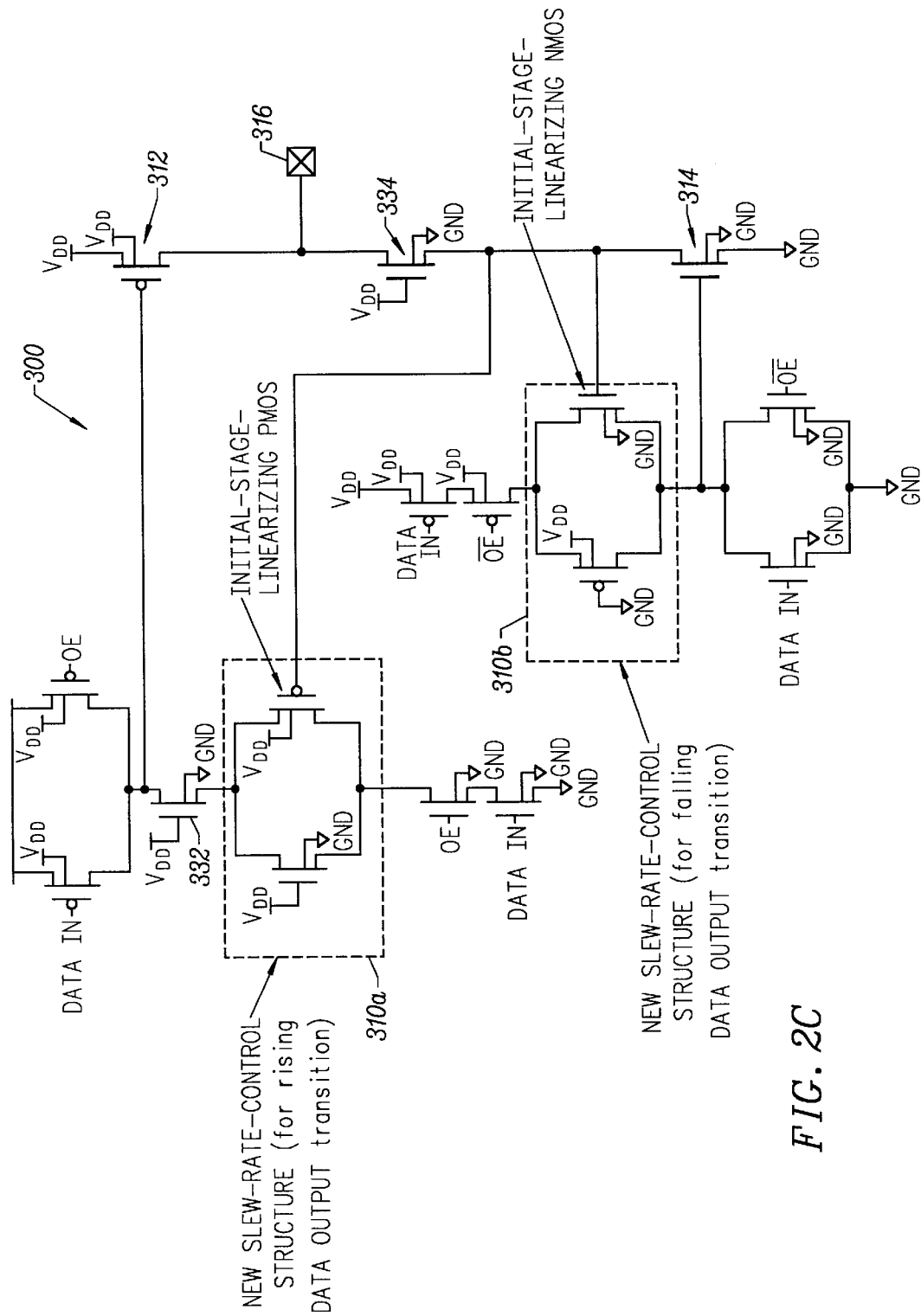
FIG. 2C shows a schematic diagram of an input/output (I/O) buffer having the embodiment of the SRC structure of FIG. 213 and high-voltage protection, or pass, transistors.

FIG. 2C shows a schematic diagram of an input/output (I/O) buffer 300 having the embodiment of the SRC structure 310 (310a and 310b) of FIG. 2B and high-voltage protection, or pass, transistors 332 and 334. High-voltage protection transistors 332 and 334 are well-known in the art. This diagram is merely an example and should not limit the scope of the claims herein. One of ordinary skill in the art would recognize many other variations, modifications, and alternatives. In a specific embodiment, high-voltage protection transistors 332 and 334 are NMOS transistors. The slew rate structures can be connected such that they are shielded from high-voltage input at an input/output (I/O) node 316. In a specific embodiment, protection transistor 332 couples between the gate of a driver transistor 312, and protection transistor 334 couples between I/O node 316 and the drain of a driver transistor 314. In operation, protection transistors 332 and 334 shield SRC structures 310a and 310b from the high-voltage at node 316. Specifically, the gates of the ISL transistors couple node 316 via protection transistor 334. Also, SRC structure 310a couples to the gate of driver transistor 312 via protection transistor 332. Process modifications such as dual-gate-oxides or other biasing circuits (not shown) can be used for protecting other transistors in the I/O buffer from high-voltages. Also, such modifications and the high-voltage protection transistors of the present invention can also be applied to other embodiments of the present invention such as those described herein.

Figure 3A:
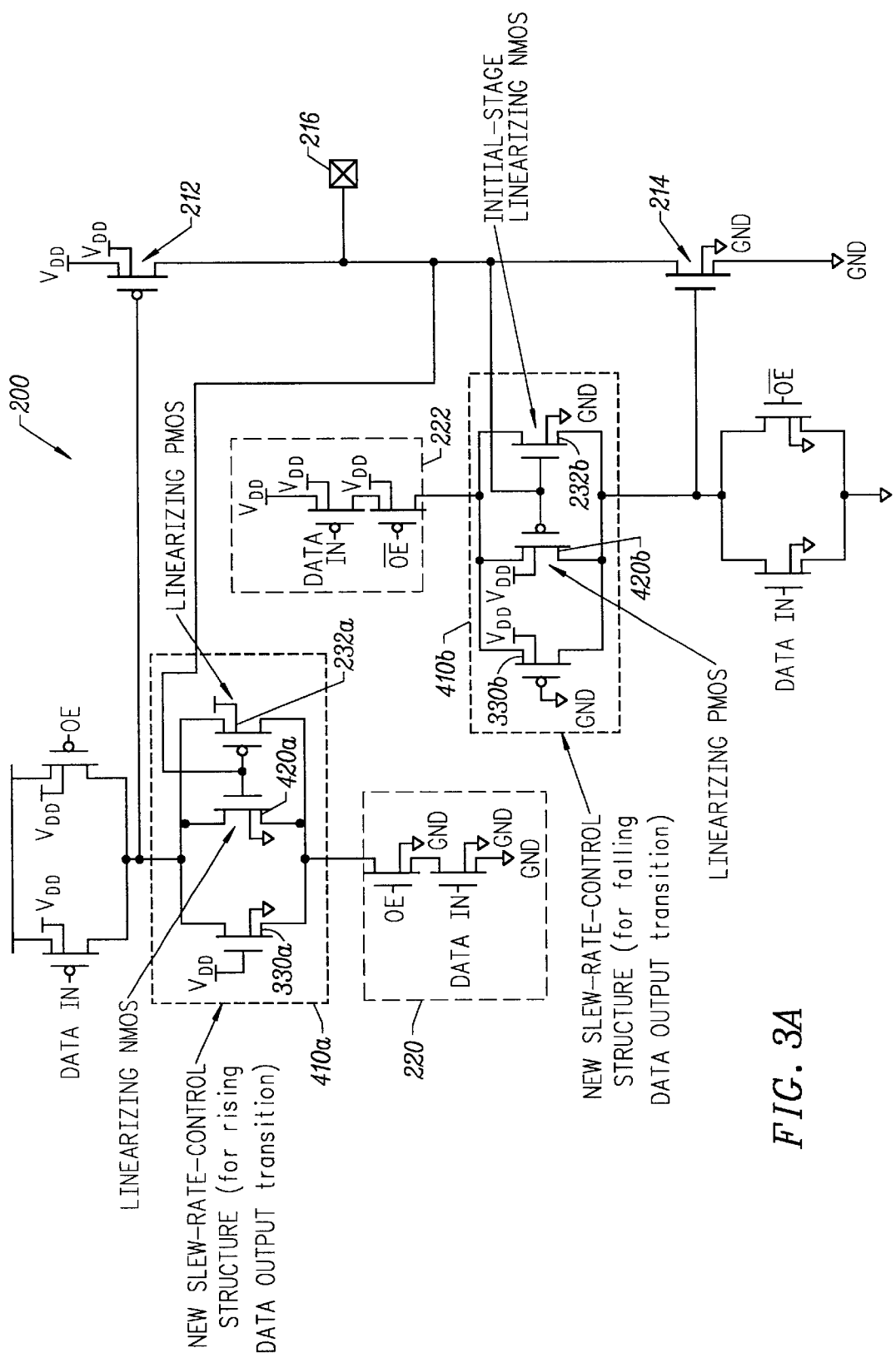
FIG. 3A shows a schematic diagram of circuit buffer of FIG. 2A having another embodiment of the SRC structure according to the present invention.

FIG. 3A shows a schematic diagram of circuit buffer 200 of FIG. 2A having another embodiment of the SRC structure 410 (410a and 410b) according to the present invention. This diagram is merely an example and should not limit the scope of the claims herein. One of ordinary skill in the art would recognize many other variations, modifications, and alternatives. In a specific embodiment, SRC structures 410a and 410b are similar to SRC structures 310a and 310b of FIG. 2B, respectively, but differ in that FSL transistors 420a and 420b are added, respectively. In specific embodiments, ISL transistor 232a, MSRC transistor 330a, and FSL transistor 420a couple in parallel between the gate of driver transistor 212 and pull-down circuit 220. Similarly, ISL transistor 232b, MSRC transistor 330b, and FSL transistor 420b couple in parallel between pull-up circuit 222 and the gate of driver transistor 214. In a specific embodiment, FSL transistor 420a is an NMOS transistor with its gate coupled to node 216, and FSL transistor 420b is a PMOS transistor with its gate also coupled to node 216.

During rising transitions, transistor 420a is substantially off during the initial and mid stages of the waveform transitions and is on during the final stage. Conversely, transistor 420b is on during the initial and mid stages and substantially off during the final stage. The reverse is true for both the ISL transistors during the falling transitions. This reduces the effective resistance of the appropriate SRC structure (structure 410a for rising transitions and 410b for falling transitions) during the final stage of the waveform transitions, thus reducing the amount of time in the final stage. This, in addition to the ISL transistor reducing the initial stage of the transitions, increases the overall switching speed. The SR can be controlled to be close to linear by choosing appropriate sizes of the transistors 420a and 420b. In another specific embodiment (not shown), transistors 330a and 330b can be left out, depending on the specific application.

Note that in certain embodiments, the ISL and FSL transistors might operate and influence the middle stage of the waveform transitions, and the ISL and FSL transistors might be on simultaneously at times. This allows precise control over the waveform during all stages. Also, the size of the transistors might or might not be the same. Their sizes will vary depending on the specific design requirements and their sizes are optimized accordingly. Further, whether any one or more stages are controlled will depend on the specific design requirements.

Figure 3B:
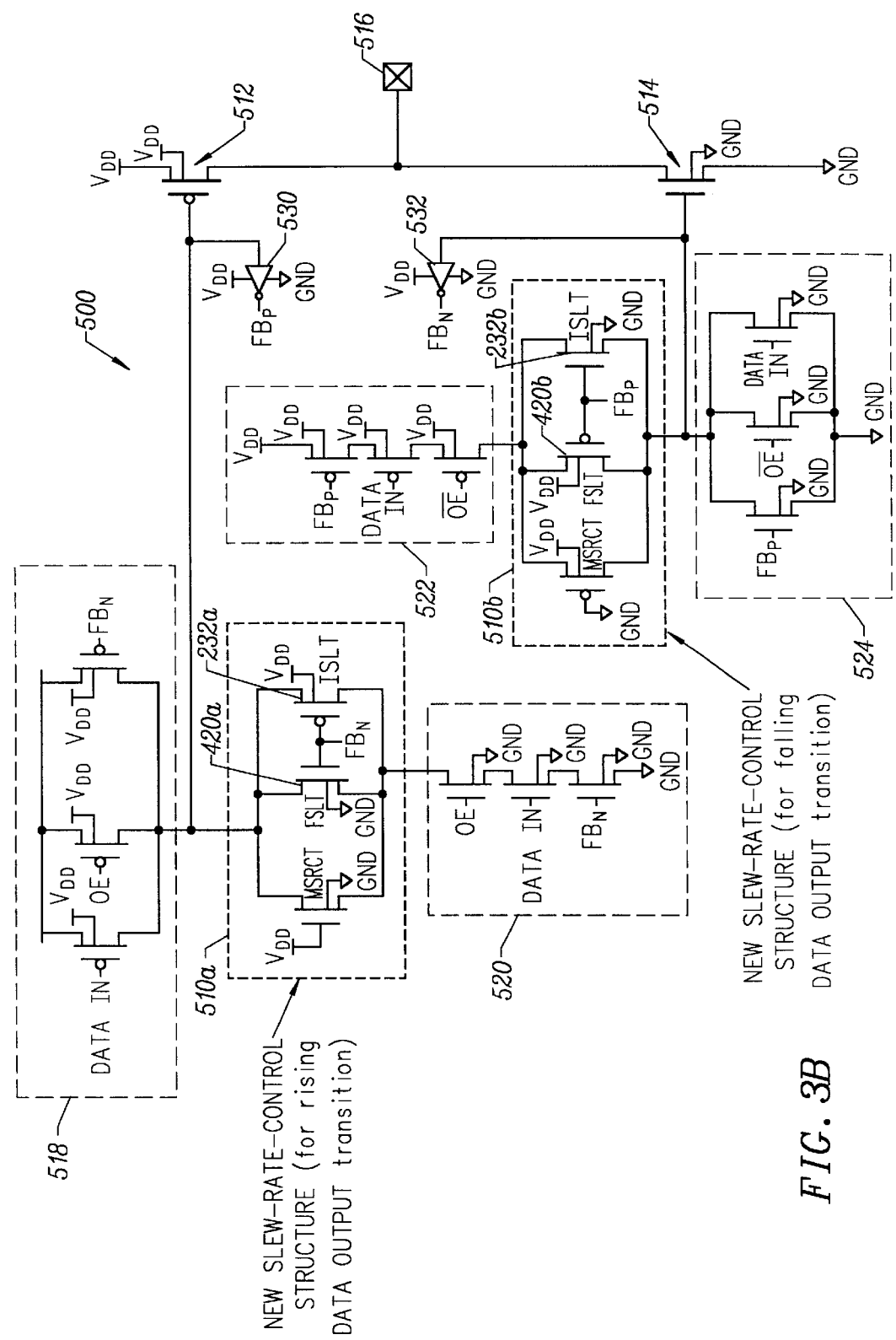
FIG. 3B shows a schematic diagram of a circuit buffer having an SRC structure for high-frequency operation according to another embodiment the present invention.

FIG. 3B shows a schematic diagram of a circuit buffer 500 having an SRC structure 510 (510a and 510b) for high-frequency operation according to another embodiment the present invention. This diagram is merely an example and should not limit the scope of the claims herein. One of ordinary skill in the art would recognize many other variations, modifications, and alternatives. In a specific embodiment, buffer 500 is an output buffer. Buffer 500 includes driver circuits 512 and 514 operatively coupled to an output node 516 to source current to a load (not shown) and to sink current from the load, respectively. In specific embodiments, driver circuit 512 is a PMOS transistor 512, and driver transistor 514 is an NMOS transistor 514. Transistors 512 and 514 couple to $V_{DD}$ and ground, respectively.

Transistor 512 operatively couples to a pre-driver pull-up circuit 518 and to a pre-driver pull-down circuit 520 via a SRC circuit 510a. Similarly, transistor 514 operatively couples to a pre-driver pull-up circuit 522 via a SRC circuit 210b and to a predriver pull-down circuit 524. Both pre-driver pull-up circuits 518 and 522 couple to $V_{DD}$, and both pre-driver pull-down circuits 520 and 524 couple to ground. Also, the pre-driver circuits are configured to receive an input signal DATA IN and an output enable signal OE. Pre-driver circuits 518 and 520 are also configured to receive a feedback signal $FB_N$, and pre-driver circuits 522 and 524 are also configured to receive a feedback signal $FB_P$.

Buffer 500 also includes feedback circuits 530 and 532. In specific embodiments, feedback circuits 530 and 532 are inverters 530 and 532, respectively. The input of inverter 530 couples to the gate of driver transistor 512, and inverter 530 outputs signal $FB_P$. Similarly, the input of inverter 530 couples to the gate of driver transistor 514, and inverter 532 outputs signal $FB_N$.

SRC circuits 510a and 510b are the same as SRC circuits 310a and 310b of FIG. 3A, respectively, except that the gates of their ISL and FSL transistors couple to the outputs of inverters 532 and 530, respectively. Otherwise, SRC circuits 510a and 510b function similarly to SRC circuits 310a and 310b, respectively.

In another embodiment (not shown), the gates of FSLT transistors could couple to node 516. In yet another embodiment (not shown), FSL transistor 420a can be replaced with a PMOS transistor with its gate coupled to the gate of the driver transistor 514, and FSL transistor 420b can be replaced with a PMOS transistor with its gate coupled to the gate of the driver transistor 512.

Figure 3C:
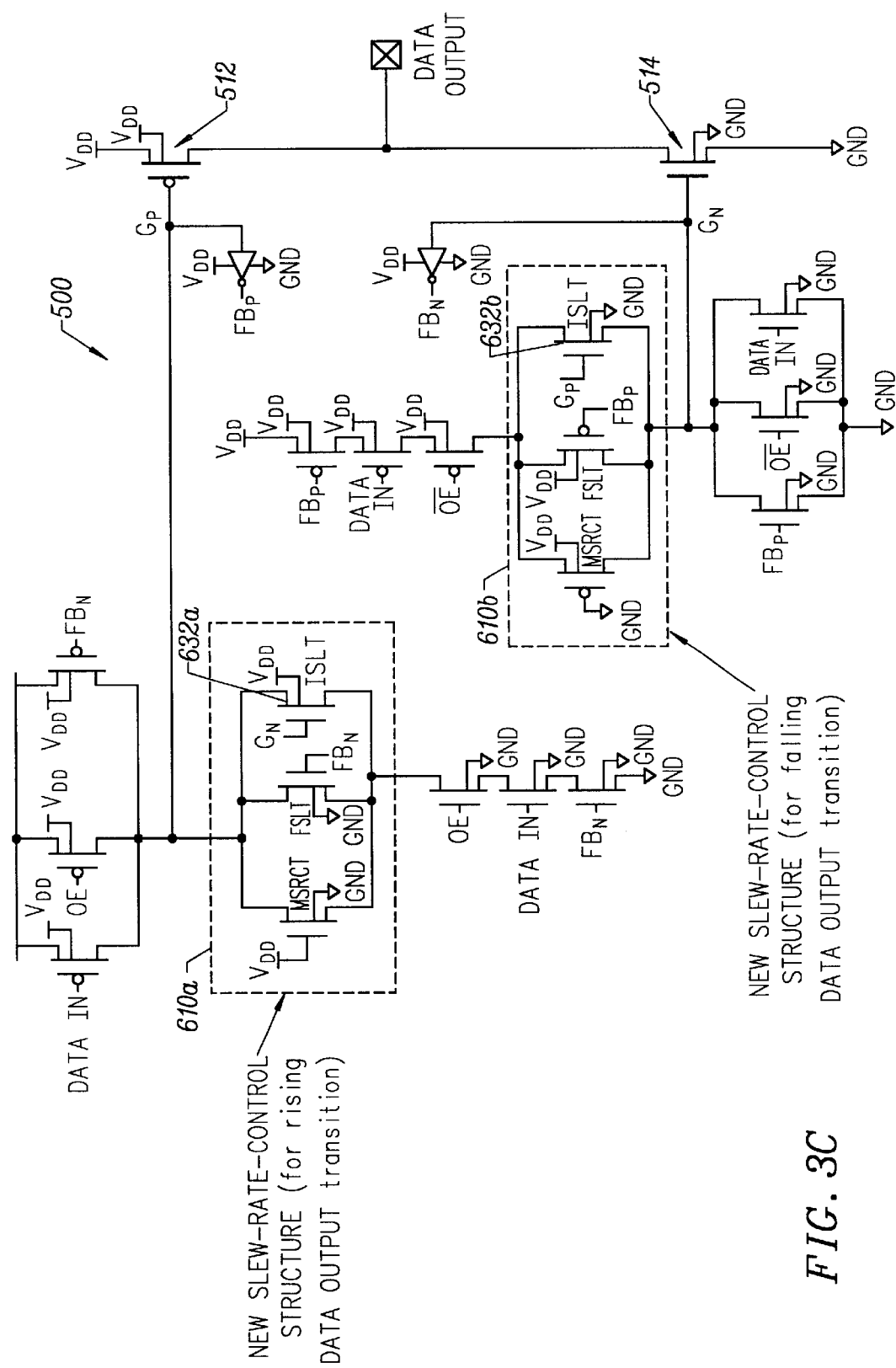
FIG. 3C shows a schematic diagram of circuit buffer having an SRC structure according to another embodiment the present invention.

FIG. 3C shows a schematic diagram of circuit buffer 500 having an SRC structure 610 (610a and 610b) according to another embodiment the present invention. This diagram is merely an example and should not limit the scope of the claims herein. One of ordinary skill in the art would recognize many other variations, modifications, and alternatives. In a specific embodiment, SRC structures 610a and 610b are the same as SRC structures 510a and 510b of FIG. 3B, respectively, except that PMOS transistor 232a of 510a is replaced with an NMOS transistor 632a and NMOS transistor 232b of 510b is replaced with an NMOS transistor 632b. In this specific embodiment, the gate of ISL transistor 632a couples to the gate of driver NMOS 514, and the gate of ISL transistor 632b couples to the gate of driver transistor 512. Otherwise, SRC circuits 610a and 610b function similarly to SRC circuits 510a and 510b, respectively.

In another specific embodiment (not shown), NMOS transistor 632a can be replaced with an PMOS transistor with its gate coupled to the gate driver transistor 512, and NMOS transistor 632b can be replaced with a PMOS transistor with its gate coupled to the gate driver transistor 514.

Figure 3D:
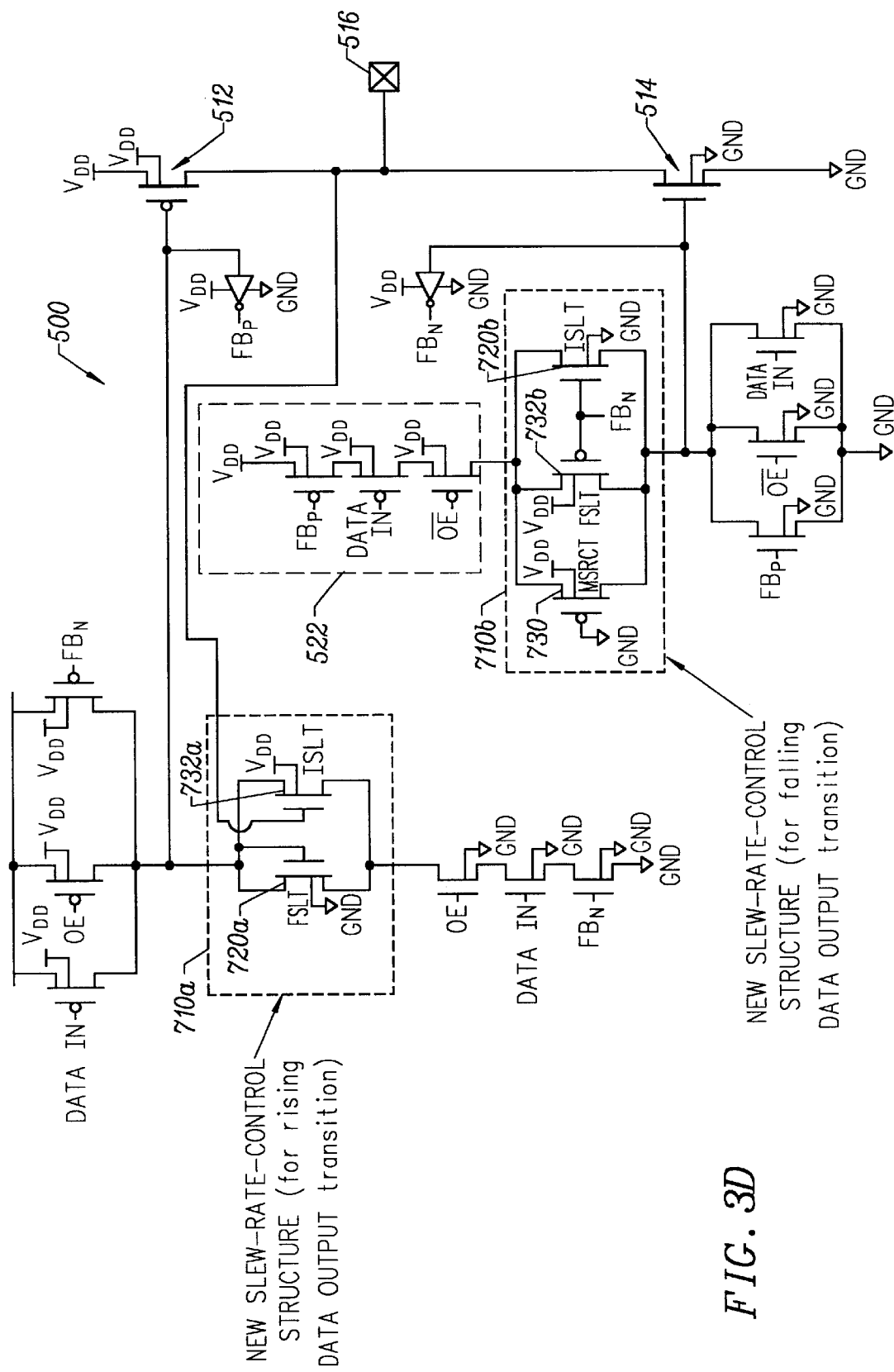
FIG. 3D shows a schematic diagram of circuit buffer having an SRC structure according to another embodiment the present invention.

FIG. 3D shows a schematic diagram of circuit buffer 500 having an SRC structure 710 (710a and 710b) according to another embodiment the present invention. This diagram is merely an example and should not limit the scope of the claims herein. One of ordinary skill in the art would recognize many other variations, modifications, and alternatives. In a specific embodiment, SRC structure 710a has an FSL transistor 720a coupled in parallel to an ISL transistor 732a between the gate of driver transistor 512. The gate of transistor 720a couples to the gate of driver transistor 512 and the gate of ISL transistor 732a couples to node 516. In this specific embodiment SRC structure 710b has an FSL transistor 720b, a ISL transistor 732b, and a MSRC transistor 730 coupled in parallel between pull-up circuit 522 and the gate of driver transistor 514.

As FIGS. 2A–3D show that the SRC components, namely the ISL, MRSC, and FSL components, can be used individually or in combination. Also, each component can be either a PMOS or an NMOS transistor having its gate biased appropriately.

Figure 1A:
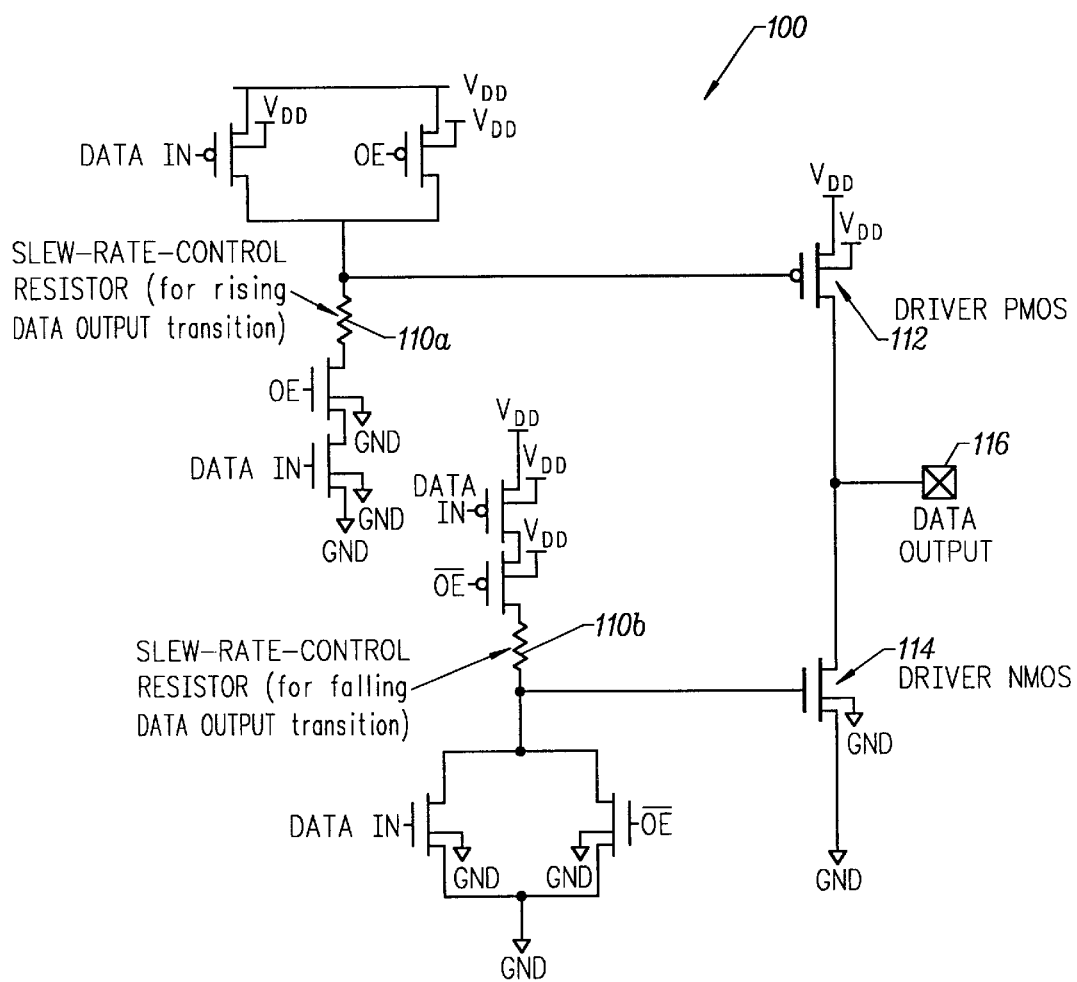
FIG. 1A shows a schematic diagram of a circuit buffer having a conventional slew-rate-control structure for high-frequency operation.
Figure 1B:
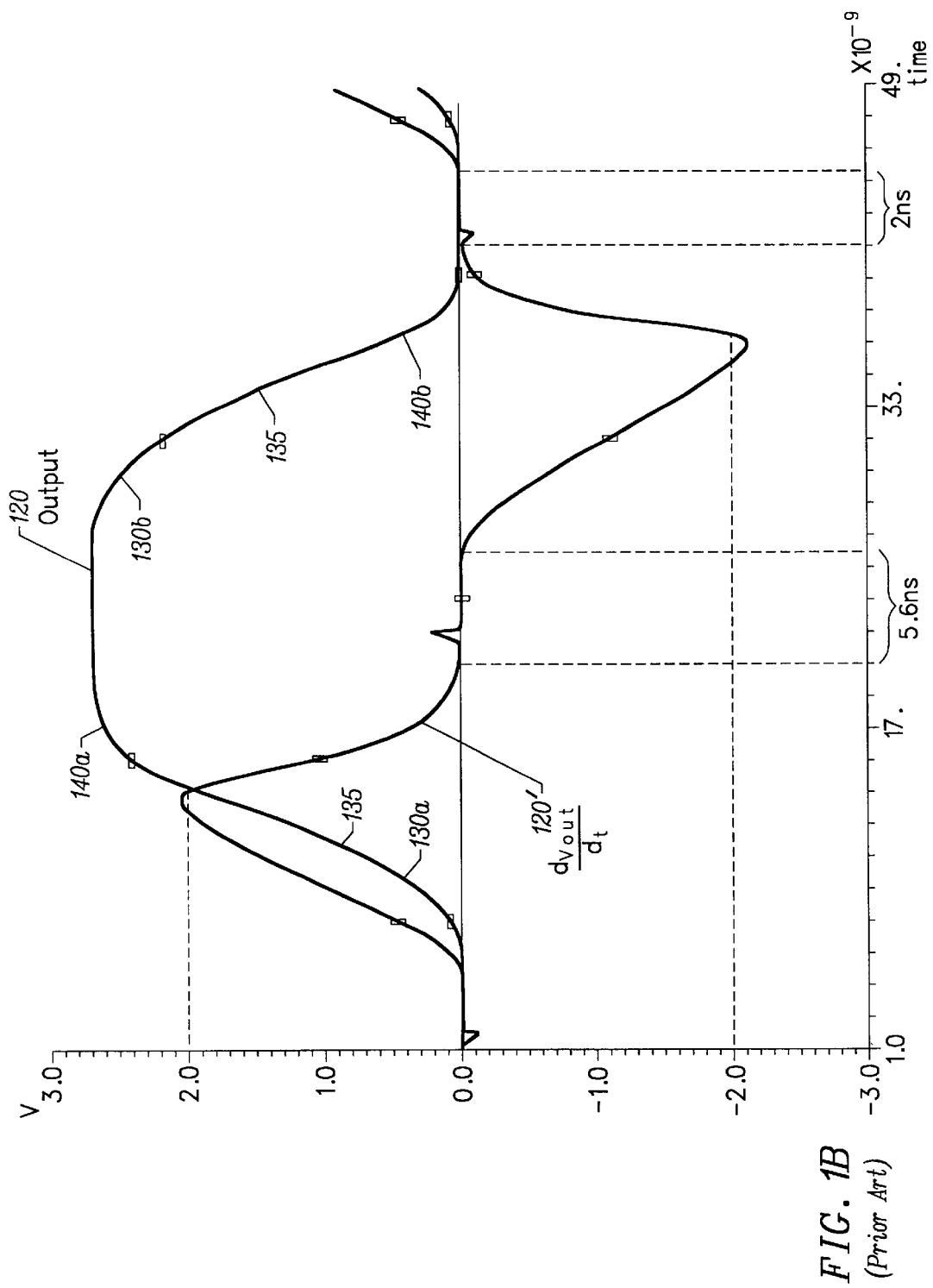
FIG. 1B shows a waveform of simulation results of a conventional slew-rate-control structure.
Figure 3E:
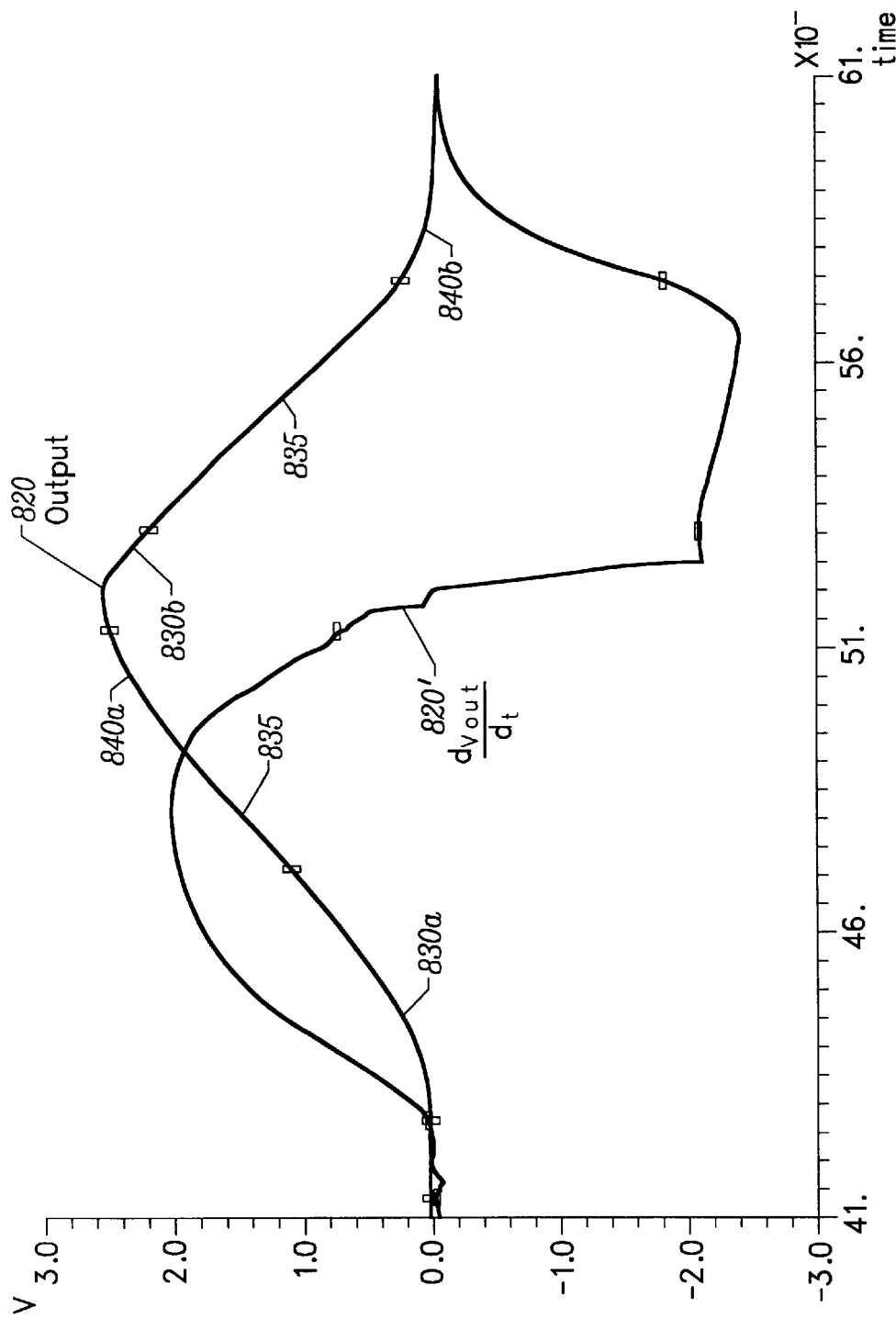
FIG. 3E shows simulation results of the new slew rate control structure shown in FIG. 3A.

FIG. 3E shows simulation results of the new slew rate control structure shown in FIG. 3A. Specifically, FIG. 3E shows an output waveform 820 of simulation results and a slew rate waveform 820', a derivative, $(d_v/d_t)$, of output waveform 820. The initial stage is defined from the 0% to 10% portion 830a of the rising waveform and from the 100% to 90% portion 830b of the falling waveform. The middle stage is defined from 10% to 90% portion 835 of the transition from low to high (rising), and from high to low (falling). The final stage is defined from the 100% to 90% portion 840a of the rising waveform and from the 0% to 10% portion 840b of the falling waveform. Note that the scale of FIG. 3E differs from that of FIG. 1B and the actual measurements will depend on variables such as temperature, transistor sizes, operating voltages, etc. As can be seen in FIG. 3E, unlike the conventional SRC structure, the SR produced by the SRC structure of the present invention is almost constant over the output-voltage transitions. This reduces the transition times while keeping the maximum slew rate under a specific value. This also allows the new invention to be operated at a higher frequency compared to that of the conventional circuit.

Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. For example, the resistance paths of the slew rate control circuit might include, instead of or in addition to transistors or resistors, other resistance controlling elements. Some specific embodiments, for example, might include diodes, etc. Also, while the slew rate control transistors shown in specific embodiments were implemented in parallel, such resistance controlling elements might be implemented in series in other specific embodiments, or might implement both series and parallel combinations. Therefore, the descriptions are not intended to be exhaustive or to limit the invention to the specific embodiments described, but is intended to be accorded the widest scope consistent with the principles and novel features disclosed herein, and as defined by the following claims.

What is claimed is:

1. An integrated circuit driver comprising:
    a driver circuit for outputting an output signal to an output node, the output signal having a waveform with rising and falling transitions, the driver circuit being configured to couple to voltage sources; and
    a slew-rate-control circuit comprising at least one resistance path configured to be switched during at least one predetermined stage of the output signal transitions, thereby changing the effective resistance during the predetermined stage to control the slope of the transitions during the predetermined stage.

2. The integrated circuit driver of claim 1 wherein at least one transistor provides the at least one resistance path.

3. The integrated circuit driver of claim 1 wherein the predetermined stage is one of an initial-stage, mid-stage, and final-stage of the output signal transitions.

4. An integrated circuit driver comprising:
    a driver circuit for outputting an output signal to an output node, the output signal having a waveform with rising and falling transitions, the driver circuit being configured to couple to voltage sources; and
    a slew-rate-control circuit comprising at least one transistor configured to switch during at least one predetermined stage of the output signal transitions, thereby changing the effective resistance during the predetermined stage to control the slope of the transitions during the predetermined stage.

5. The integrated circuit driver of claim 4 wherein the predetermined stage is one of an initial-stage, mid-stage, and final-stage of the output signal transitions.

6. The integrated circuit driver of claim 4 wherein the slew-rate-control circuit further comprises at least one transistor configured to switch on during at least one predetermined stage of the output signal during transitions.

7. The integrated circuit driver of claim 4 wherein the driver circuit comprises at least two complementary output transistors and at least one slew-rate-control transistor having a gate coupled to the output node.

8. The integrated circuit driver of claim 7 wherein the driver circuit has at least one feedback circuit having an input coupled to the gate one of the complementary transistors and an output coupled to the gate of at least one of the slew-rate-control transistors.

9. The integrated circuit driver of claim 4 wherein the driver circuit comprises at least two complementary output transistors and at least one slew-rate-control transistor having a gate coupled to the gate of at least one of the complementary output transistors.

10. The integrated circuit driver of claim 4 wherein the slew-rate-control circuit reduce s its effective resistance during the predetermined stage such that the slope of the transitions of the output signal is substantially constant during an initial-stage, mid-stage, and final-stage of the output signal transitions.

11. The integrated circuit driver of claim 4 wherein the slew-rate-control circuit reduces its effective resistance during the predetermined stage such that the transitions of the output signal are substantially linear during an initial-stage, mid-stage, and final-stage of the output signal transitions.

12. The integrated circuit driver of claim 4 wherein the driver circuit further comprises a high-voltage circuit coupled between the output node and the slew-rate-control circuit to protect the slew-rate-control circuit against high-voltages.

13. The integrated circuit driver of claim 12 wherein the high-voltage circuit is a transistor.

14. The integrated circuit driver of claim 4 wherein the slew-rate-control circuit further comprises a first and a second control circuit, the first control circuit being configured for controlling the effective resistance of the control circuit during rising transitions, the second control circuit being configured for controlling the effective resistance of the slew-rate control circuit during falling transitions.

15. A method for controlling the slew rate of a driver circuit, the method comprising:

outputting an output signal to an output node of the driver circuit;

switching on at least one transistor of a slew-rate-control circuit during at least one predetermined stage of the output signal during rising transitions of the output waveform; and switching off the at least one transistor during at least one predetermined stage of the output signal during falling transitions, the slew-rate-control circuit reducing its effective resistance during the predetermined stage such that the slope of the transition of the output waveform is controlled during the predetermined stage.

16. An integrated circuit driver comprising:

a driver circuit for outputting an output signal to an output node, the output signal having a waveform with rising and falling transitions, the driver circuit being configured to couple to voltage sources;

a pre-driver pull-up circuit comprising an output enable transistor and a data in transistor;

a pre-driver pull-down circuit comprising an output enable transistor and a data in transistor; and a slew-rate-control circuit comprising at least one resistance path configured to be switched during at least one predetermined stage of the output signal transitions, thereby changing the effective resistance during the predetermined stage to control the slope of the transitions during the predetermined stage.

* * * * *